(12) United States Patent
Park et al.

(10) Patent No.: US 11,133,776 B2
(45) Date of Patent: Sep. 28, 2021

(54) PHOTOVOLTAIC MODULE

(71) Applicant: LG ELECTRONICS INC., Seoul (KR)

(72) Inventors: Giyob Park, Seoul (KR); Myonghwan Kim, Seoul (KR); Byoungsu Yoon, Seoul (KR); Youngbok Jung, Seoul (KR); Kyungsoo Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 302 days.

(21) Appl. No.: 16/138,429

(22) Filed: Sep. 21, 2018

(65) Prior Publication Data
US 2019/0097576 A1 Mar. 28, 2019

(30) Foreign Application Priority Data

Sep. 22, 2017 (KR) .................. 10-2017-0122785

(51) Int. Cl.
*H02S 40/32* (2014.01)
*H02S 40/34* (2014.01)
(Continued)

(52) U.S. Cl.
CPC .......... *H02S 40/32* (2014.12); *H01L 31/0504* (2013.01); *H02M 7/4807* (2013.01);
(Continued)

(58) Field of Classification Search
CPC .......... H02S 40/32; H02S 40/34; H02S 40/38; H01L 31/0504; H02M 3/22; H02M 3/24;
(Continued)

(56) References Cited

U.S. PATENT DOCUMENTS

2006/0062034 A1* 3/2006 Mazumder .......... H02M 7/4807
   363/131
2014/0268959 A1* 9/2014 Frohman ............... H02M 7/797
   363/98

(Continued)

FOREIGN PATENT DOCUMENTS

| EP | 2365599 A1 | 9/2011 |
| KR | 10-2015-0094130 A | 8/2015 |
| WO | WO 2011/102910 A1 | 8/2011 |

OTHER PUBLICATIONS

De Haan et al., "Test Results of a 130W AC Module; a modular solar ac power station," First WCPEC, Dec. 5-9, 1994, pp. 925-928.

*Primary Examiner* — Golam Mowla
(74) *Attorney, Agent, or Firm* — Birch, Stewart, Kolasch & Birch LLP

(57) ABSTRACT

Discussed is a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter comprises: a full-bridge switching part to switch the first DC power; a transformer having an input side connected to an output terminal of the full-bridge switching part; and a half-bridge switching part connected to an output side of the transformer, wherein the controller changes a switching frequency of the full-bridge switching part and the half-bridge switching part in a first section of a waveform.

20 Claims, 17 Drawing Sheets

(51) Int. Cl.
*H02S 40/38* (2014.01)
*H01L 31/05* (2014.01)
*H02M 7/48* (2007.01)
*H02J 3/38* (2006.01)
*H02M 1/00* (2006.01)
*H02M 7/44* (2006.01)

(52) U.S. Cl.
CPC .............. *H02S 40/34* (2014.12); *H02S 40/38* (2014.12); *H02J 3/383* (2013.01); *H02M 1/007* (2021.05); *H02M 1/0009* (2021.05); *H02M 1/0054* (2021.05); *H02M 7/44* (2013.01)

(58) Field of Classification Search
CPC ........ H02M 3/325; H02M 3/335; H02M 3/28; H02M 3/33569; H02M 3/33538; H02M 3/33546; H02M 3/33507; H02M 3/5383; H02M 3/5387; H02M 3/53871
See application file for complete search history.

(56) References Cited

U.S. PATENT DOCUMENTS

2016/0268890 A1 9/2016 Ayai et al.
2018/0191165 A1* 7/2018 Ehlmann ........... H01L 31/02021

* cited by examiner

FIG. 12
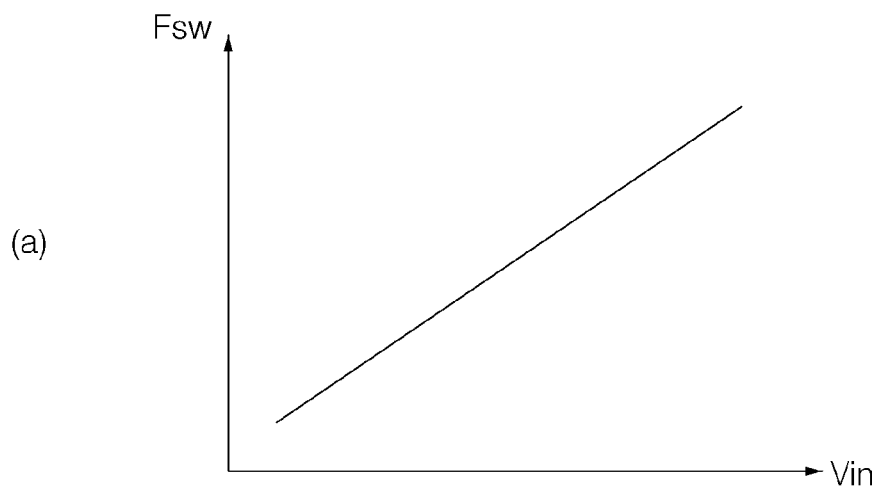
(a)
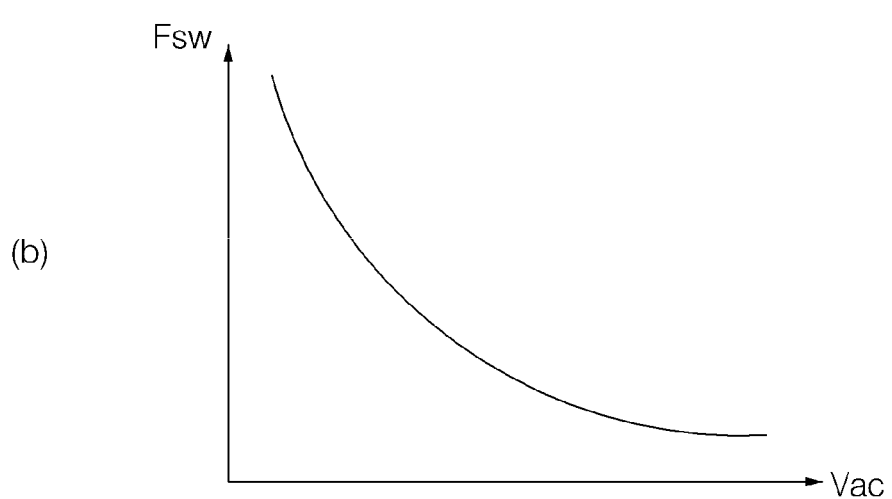
(b)

PHOTOVOLTAIC MODULE

CROSS-REFERENCE TO RELATED APPLICATION

This application claims the priority benefit of Korean Patent Application No. 10-2017-0122785, filed on Sep. 22, 2017 in the Korean Intellectual Property Office, the disclosure of which is incorporated herein by reference in its entirety.

BACKGROUND OF THE INVENTION

1. Field of the Invention

The present disclosure relates to a photovoltaic module, and more particularly, to a photovoltaic module which can provide stable power output.

2. Description of the Related Art

Recently, as existing energy resources, such as oil and coal, are predicted to be depleted, there has been an increasing interest in alternative energy resources to replace the existing energy resources. Among the alternative energy resources, solar cells, which directly convert solar energy into electrical energy by using a semiconductor device, has received attention as a next-generation cell.

The photovoltaic module refers to a device in which solar cells for solar energy generation are connected in series or in parallel.

In the instance where the photovoltaic module outputs alternating current (AC) power to a grid by using a converter and an inverter, if electricity produced by the solar cells is low, power is low even after power conversion. Accordingly, research continues to develop a photovoltaic module which can provide stable power output.

SUMMARY OF THE INVENTION

It is an object of the present invention to provide a photovoltaic module which can provide stable power output.

It is another object of the present invention to provide a photovoltaic module which can reduce the size of a transformer in the photovoltaic module.

In accordance with an aspect of the present invention, the above and other objects can be accomplished by the provision of a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter includes: a full-bridge switching part to switch the first DC power; a transformer having an input side connected to an output terminal of the full-bridge switching part; and a half-bridge switching part connected to an output side of the transformer, wherein the controller changes a switching frequency of the full-bridge switching part and the half-bridge switching part in a first section of a waveform.

Further, in accordance with another aspect of the present invention, the above and other objects can be accomplished by the provision of a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter includes: a full-bridge switching part to switch the first DC power; a transformer having an input side connected to an output terminal of the full-bridge switching part; and a half-bridge switching part connected to an output side of the transformer, wherein when changing a switching frequency of the full-bridge switching part and the half-bridge switching part, the controller changes a first phase difference between the full-bridge switching part and the half-bridge switching part.

Moreover, in accordance with yet another aspect of the present invention, the above and other objects can be accomplished by the provision of a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter includes: a full-bridge switching part to switch the first DC power; a transformer having an input side connected to an output terminal of the full-bridge switching part; and a half-bridge switching part connected to an output side of the transformer, wherein the controller controls driving of the full-bridge switching part and the half-bridge switching part by separating a section where a switching frequency of the full-bridge switching part and the half-bridge switching part is changed from a section where the switching frequency of the full-bridge switching part and the half-bridge switching part is constant, according to a waveform of an output voltage of the inverter.

BRIEF DESCRIPTION OF THE DRAWINGS

FIGS. 7 to 12 are diagrams referred to in explaining the power converting device of FIG. 6.

DETAILED DESCRIPTION OF THE EMBODIMENTS

In the present disclosure, as a method of reducing loss of output power which is output from a photovoltaic module, there is provided a method of controlling a power factor which is a phase difference between an alternating current and an alternating voltage which are output from the photovoltaic module.

Hereinafter, embodiments of the present disclosure will be described in detail with reference to the accompanying drawings.

In the following description, the terms "module" and "unit", which are used herein to signify components, are merely intended to facilitate explanation of the present disclosure, and the terms do not have any distinguishable difference in meaning or role. Thus, the terms "module" and "unit" can be used interchangeably.

Figure 1:
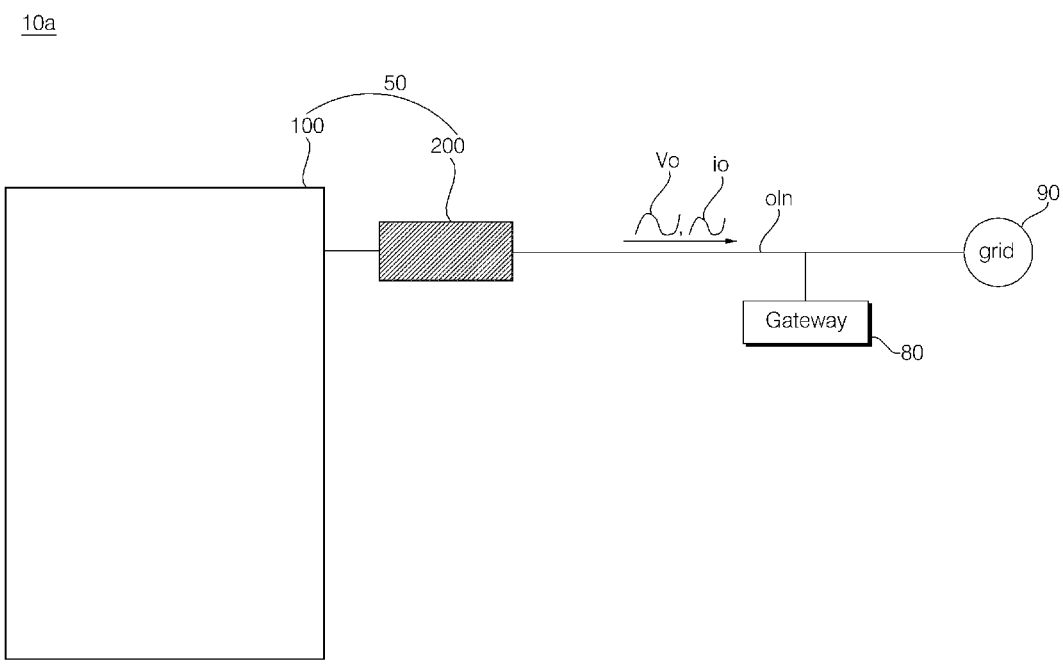
FIG. 1 is a diagram illustrating an example of a photovoltaic system including a photovoltaic module according to an embodiment of the present invention.

FIG. 1 is a diagram illustrating an example of a photovoltaic system including a photovoltaic module according to an embodiment of the present invention. All components of the photovoltaic system including the photovoltaic module according to all embodiments of the present invention are operatively coupled and configured.

Referring to FIG. 1, the photovoltaic system 10a can include a photovoltaic module 50 and a gateway 80.

The photovoltaic module 50 can include a solar cell module 100, and a junction box 200 including a power converting device (500 in FIG. 6) which converts direct current (DC) power supplied from the solar cell module and outputs the converted DC power.

The junction box 200 can be attached on a rear surface of the solar cell module 100, or can be spaced apart from the solar cell module 100 to be provided separately therefrom.

A cable oln can be electrically connected to an output terminal of the junction box 200 to supply alternating current (AC) power, which is output from the junction box 200, to a grid.

The gateway 80 can be interposed between the junction box 200 and the grid 90.

Further, the gateway 80 can detect an alternating current io and an alternating voltage vo which flow through the cable oln and are output from the photovoltaic module 50.

In addition, the gateway 80 can output a power factor adjustment signal for adjusting a power factor based on a phase difference between the alternating current io and the alternating voltage vo which are output from the photovoltaic module 50.

To this end, the gateway 80 and the photovoltaic module 50 can perform power line communication (PLC) by using a cable 323.

The power converting device (500 in FIG. 6) included in the photovoltaic module 50 can convert DC power, output from the solar cell module 100, into AC power, and can output the converted power.

Figure 6:
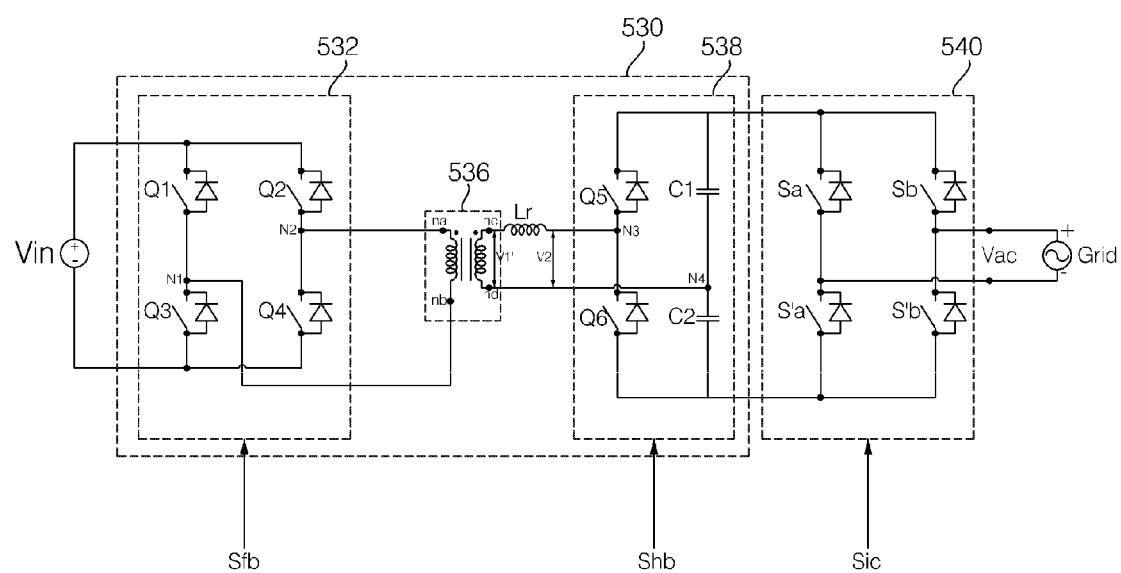
FIG. 6 is a circuit diagram of a power converting device in a photovoltaic module according to an embodiment of the present invention.

To this end, the power converting device (500 in FIG. 6) included in the photovoltaic module 50 can include a converter (530 in FIG. 6) and an inverter (540 in FIG. 6).

In the present disclosure, description is made based on a two-stage power converting device, in which the converter 530 included in the power converting device (500 in FIG. 6) converts a level of DC power supplied from the solar cell module 100, and then the inverter 540 converts the AC power.

Further, in the present disclosure, there is provided a method of performing stable power output in the two-stage power converting device. Particularly, even when DC power input from the solar cell module 100 is low, stable power output can be provided without limiting the range of output power.

To this end, the photovoltaic module 50 according to an embodiment of the present invention can include the solar cell module 100, the converter 530, the inverter 540, and the controller 550.

Particularly, the converter 530 can include a full-bridge switching part 523, a transformer 536, and a half-bridge switching part 538.

In one embodiment of the present invention, the controller 550 can change a switching frequency of the full-bridge switching part 523 and the half-bridge switching part 538 in a first section Pba and Pbb. In this manner, by changing the switching frequency of the full-bridge switching part 523 and the half-bridge switching part 538, stable power output can be provided.

In another embodiment of the present invention, when changing the switching frequency of the full-bridge switching part 523 and the half-bridge switching part 538, the controller 550 can change a first phase difference between the full-bridge switching part 523 and the half-bridge switching part 538, thereby providing stable power output.

Further, in yet another embodiment of the present invention, the controller 550 can control driving of the full-bridge switching part 532 and the half-bridge switching part 538 by separating a section where the switching frequency of the full-bridge switching part 532 and the half-bridge switching part 538 is changed from a section where the switching frequency of the full-bridge switching part 532 and the half-bridge switching part 538 is constant, according to a waveform of an output voltage Vac of the inverter 540.

Figure 2:
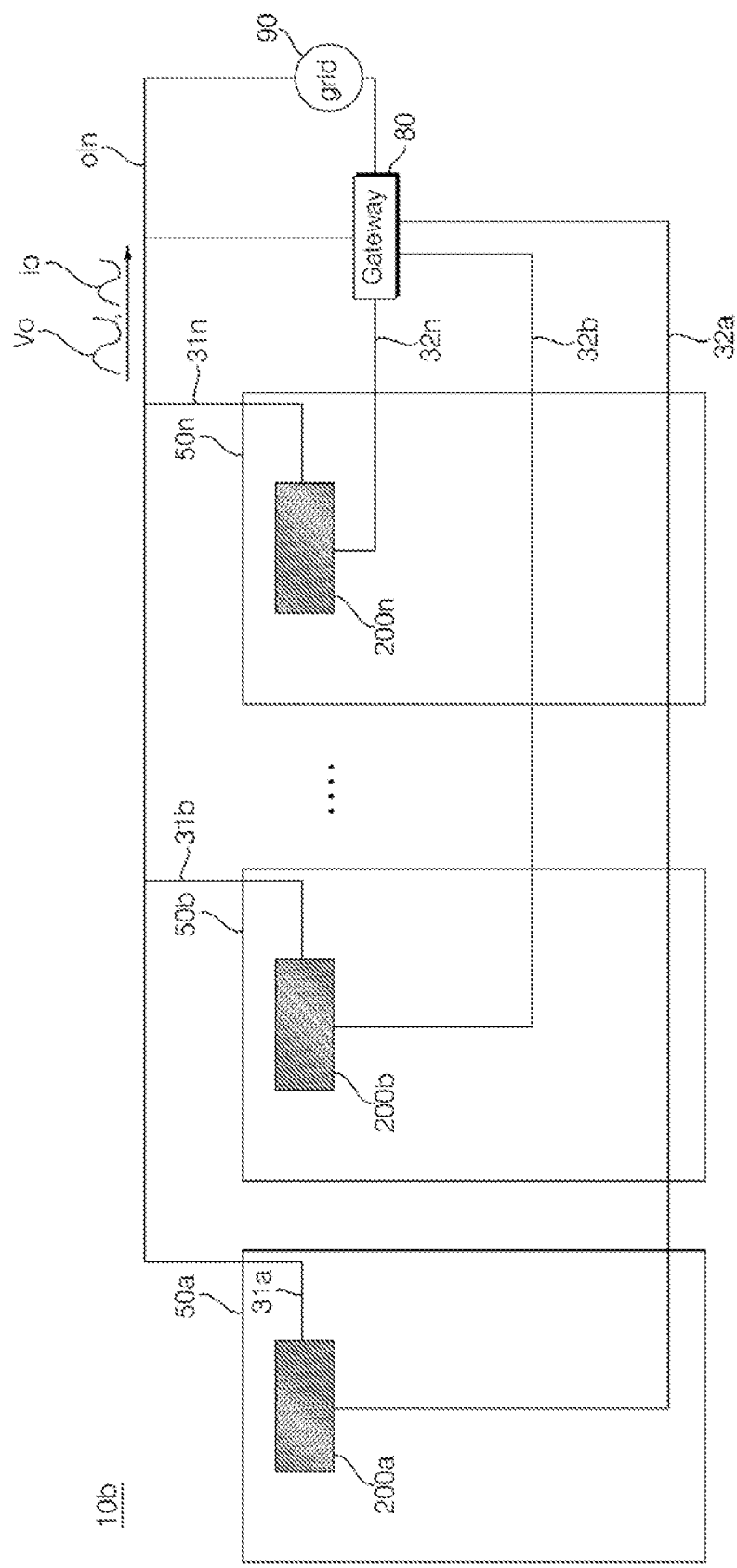
FIG. 2 is a diagram illustrating another example of a photovoltaic system including a photovoltaic module according to an embodiment of the present invention.

FIG. 2 is a diagram illustrating another example of a photovoltaic system including a photovoltaic module according to an embodiment of the present invention.

Referring to FIG. 2, the photovoltaic system 10b can include a plurality of photovoltaic modules 50a, 50b, . . . , and 50n and a gateway 80.

Unlike the photovoltaic system 10a of FIG. 1, the photovoltaic system 10b of FIG. 2 includes the plurality of photovoltaic modules 50a, 50b, . . . , and 50n which are connected in parallel with each other.

The plurality of photovoltaic modules 50a, 50b, and 50n each include solar cell modules 100a, 100b, . . . , and 100n; and junction boxes 200a, 200b, . . . , and 200n including a circuit device which converts DC power input from the photovoltaic module and outputs the converted DC power.

In FIG. 2, each of the junction boxes 200a, 200b, . . . , and 200n is attached on a rear surface of each of the solar cell modules 100a, 100b, . . . , and 100n, but is not limited thereto, and each of the junction boxes 200a, 200b, . . . , and 200n can be spaced apart from each of the solar cell modules 100a, 100b, . . . , and 100n to be provided separately therefrom.

Cables 31a, 31b, . . . , and oln can be electrically connected to an output terminal of each of the junction boxes 200a, 200b, . . . , and 200n to supply alternating current (AC) power, which is output from each of the junction boxes 200a, 200b, . . . , and 200n, to a grid.

The controller 550 of each of the plurality of photovoltaic modules 50a, 50b, . . . , and 50n in FIG. 2 can change a switching frequency of the full-bridge switching part 523 and the half-bridge switching part 538 in the first section Pba and Pbb.

Further, when changing the switching frequency of the full-bridge switching part 523 and the half-bridge switching part 538, the controller 550 of each of the plurality of photovoltaic modules 50a, 50b, . . . , and 50n in FIG. 2 can change a first phase difference between the full-bridge switching part 523 and the half-bridge switching part 538.

In addition, the controller 550 of each of the plurality of photovoltaic modules 50a, 50b, . . . , and 50n in FIG. 2 can control driving of the full-bridge switching part 532 and the half-bridge switching part 538 by separating a section where the switching frequency of the full-bridge switching part 532 and the half-bridge switching part 538 is changed from a section where the switching frequency of the full-bridge switching part 532 and the half-bridge switching part 538 is constant, according to a waveform of an output voltage Vac of the inverter 540.

Figure 3:
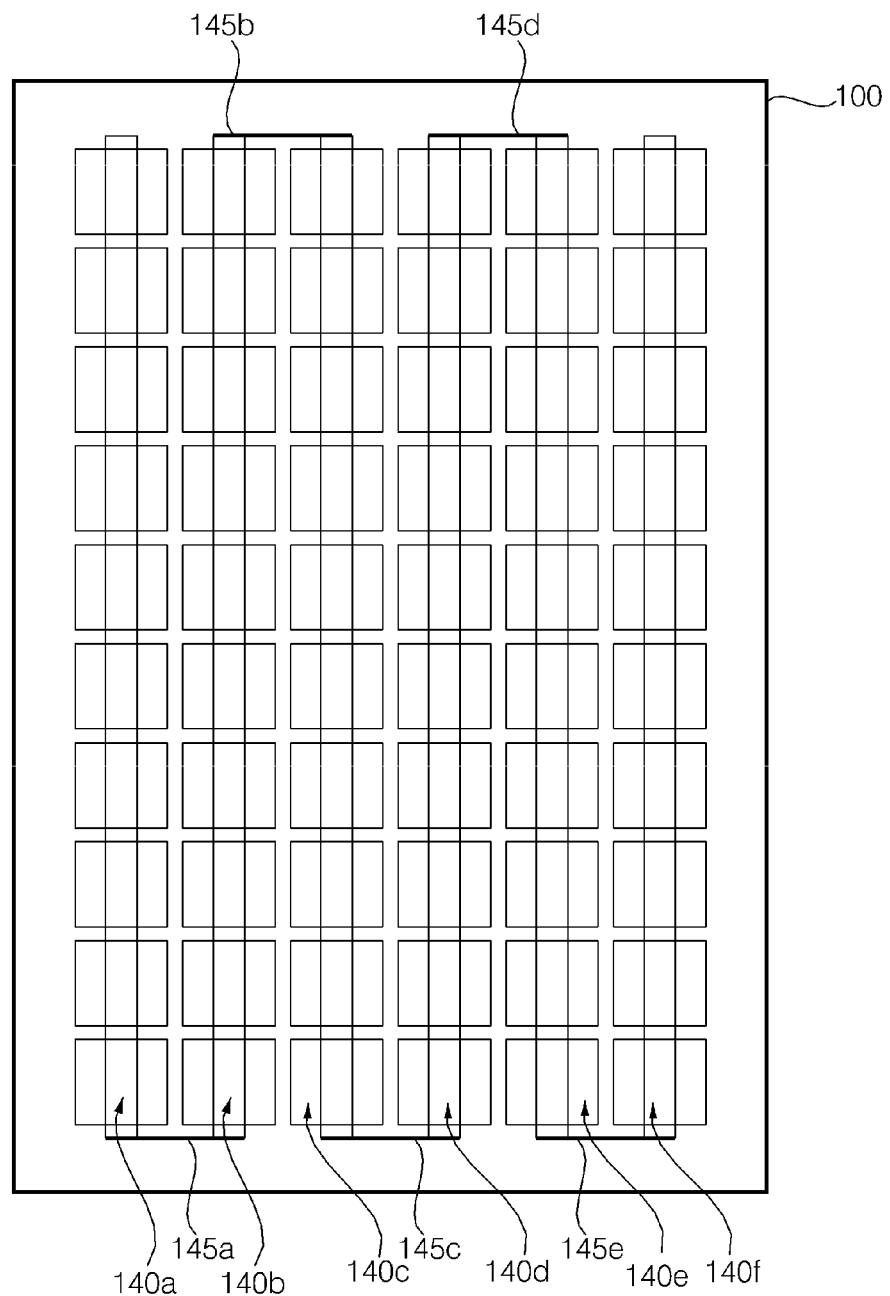
FIG. 3 is a front view of a photovoltaic module according to an embodiment of the present invention.

FIG. 3 is a front view of a photovoltaic module according to an embodiment of the present invention.

Referring to FIG. 3, the photovoltaic module 50 according to an embodiment of the present invention can include a solar cell module 100, and a junction box 200 which is disposed on a rear surface of the solar cell module 100.

The junction box 200 can include at least one bypass diode which can bypass DC power in order to prevent a hot spot when a shade phenomenon occurs.

Figure 4:
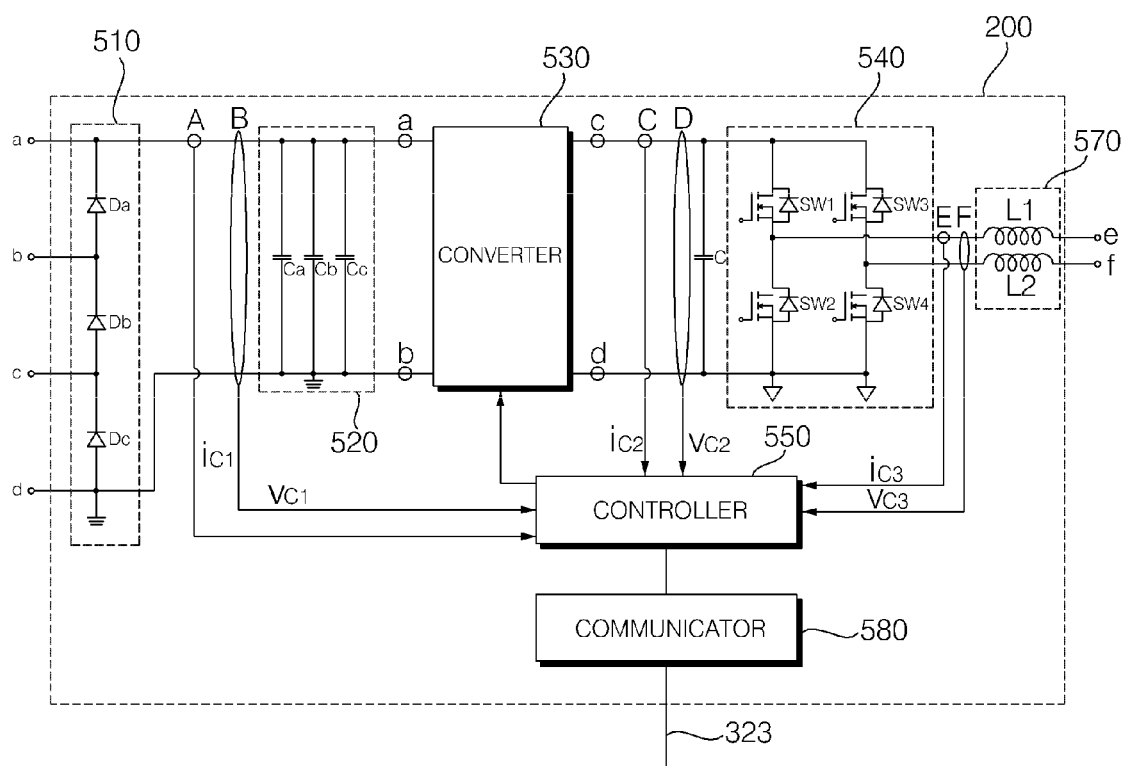
FIG. 4 is a circuit diagram of a junction box in the photovoltaic module of FIG. 3.

FIG. 4 and the following drawings illustrate the junction box 200 including three bypass diodes (Da, Db, Dc in FIG. 4) as opposed to four solar cell strings of FIG. 3.

The junction box 200 can convert DC power supplied from the solar cell module 100, which will be described with reference to FIG. 4 and the following drawings.

The solar cell module 100 can include a plurality of solar cells.

In the drawings, the plurality of solar cells are connected in series through a ribbon (133 in FIG. 13) to form a solar cell string 140. In this manner, six strings 140a, 140b, 140c, 140d, 140e, and 140f are formed, and each string includes 10 solar cells. However, unlike the drawings, various modifications can be made.

Solar cell strings can be electrically connected with each other through a bus ribbon. As illustrated in FIG. 3, a first solar cell string 140a and a second solar cell string 140b are electrically connected, a third solar cell string 140c and a fourth solar cell string 140d are electrically connected, and a fifth solar cell string 140e and a sixth solar cell string 140f are electrically connected, by the respective bus ribbons 145a, 145c, and 145e disposed at a lower portion of the solar cell 100.

Further, as illustrated in FIG. 3, the second solar cell string 140b and the third solar cell string 140c are electrically connected, and the fourth solar cell string 140d and the fifth solar cell string 140e are electrically connected, by the respective bus ribbons 145b and 145d disposed at an upper portion of the solar cell 100.

The ribbon connected to the first string, the bus ribbons 145b and 145d, and the ribbon connected to the fourth string are electrically connected to a first to a fourth conductive lines respectively. The first to fourth conductive lines can be connected to bypass diodes (Da, Db, and Dc in FIG. 4) in the junction box 200, which is disposed on a rear surface of the solar cell module 100, through an opening formed at the solar cell module 100.

In this instance, the opening formed at the solar cell module 100 can be formed at a position corresponding to a position where the junction box 200 is located.

FIG. 4 is a circuit diagram of a junction box in the photovoltaic module of FIG. 3.

Referring to FIG. 4, the junction box 200 can convert DC power supplied from the solar cell module 100, and can output the converted power.

Particularly, in the present disclosure, the junction box 200 can include a power converting device for outputting AC power.

To this end, the junction box 200 can include a converter 530, an inverter 540, and a controller 550 to control the same.

Further, the junction box 200 can further include a bypass diode part 510 for bypassing, a capacitor part 520 for storing DC power, and a filter 570 for filtering output AC power.

In addition, the junction box 200 can further include a communicator 580 for communication with an external gateway 80.

Moreover, the junction box 200 can further include an input current detector A, an input voltage detector B, a converter output current detector C, a converter output voltage detector D, an inverter output current detector E, and an inverter output voltage detector F.

The controller 550 can control the converter 530, the inverter 540, and the communicator 580.

The bypass diode 510 can include bypass diodes Dc, Db, and Da, each of which is disposed between the first to fourth conductive lines of the solar cell module 100. In this instance, the number of the bypass diodes is one or more, and is desired to be less by 1 than the number of conductive lines.

The bypass diodes Dc, Db, and Da receive photovoltaic DC power from the solar cell module 100, particularly from the first to fourth conductive lines of the solar cell module 100. Further, when a reverse voltage is generated from DC power supplied from at least one of the first to the fourth conductive lines, the bypass diodes Dc, Db, and Da can bypass the supplied DC power.

After passing through the bypass diode part 510, the DC current can be input to the capacitor part 520.

The capacitor part 520 can store the input DC current which is input after passing through the solar cell module 100 and the bypass diode part 510.

In the drawing, the capacitor part 520 includes a plurality of capacitors Ca, Cb, and Cc which are connected in parallel. However, unlike the drawing, a plurality of capacitors can be connected in a combination of series and parallel connections, or can be connected in series to a ground terminal. Alternatively, the capacitor part 520 can include only one capacitor.

The converter 530 can convert a level of voltage input from the solar cell module 100 after passing through the bypass diode 510 and the capacitor part 520.

Particularly, the converter 530 can perform power conversion by using the DC current stored in the capacitor part 520.

The converter 530 according to an embodiment of the present invention will be described in further detail with reference to FIG. 6.

Switching elements in the converter 530 can be turned on/off based on a converter switching control signal from the controller 550. In this manner, a level-converted DC power can be output.

The inverter 540 can convert the DC power, which is level-converted by the converter unit 530, into AC power.

In the drawing, a full-bridge inverter is illustrated, in which upper arm switching elements Sa and Sb and lower arm switching elements S'a and S'b, which are connected in series with each other, form pairs such that a total of two pairs of upper and lower arm switching elements are connected in parallel (Sa & S'a and Sb & S'b) with each other. A diode can be connected in inverse parallel to each of the switching elements Sa, Sb, S'a, and S'b.

The switching elements Sa, Sb, S'a, and S'b in the inverter 540 can be turned on and off based on an inverter switching control signal from the controller 550. In this manner, AC power having a predetermined frequency can be output, in which it is desired that AC power has the same frequency (about 60 Hz or 50 Hz) as an AC frequency of the grid.

The capacitor C can be interposed between the converter 530 and the inverter 540.

The capacitor C can store the level-converted DC power of the converter 530. Both ends of the capacitor C can be referred to as DC ends, and accordingly, the capacitor C can be referred to as a DC end capacitor.

The input current detector A can detect the input current ic1 supplied from the solar cell module 100 to the capacitor part 520.

The input voltage detector B can detect the input voltage vc1 supplied from the solar cell module 100 to the capacitor part 520. Here, the input voltage vc1 can be the same as the voltage stored on both ends of the capacitor unit 520.

The detected input current ic1 and input voltage vc1 can be input to the controller 550.

The converter output current detector C detects an output current ic2, namely DC end current, which is output from the converter 530, and the converter output voltage detector D detects an output voltage vc2, namely DC end voltage, which is output from the converter 530. The detected output current i2 and output voltage vc2 can be input to the controller 550.

An inverter output current detector E detects current ic3 output from the inverter 540, and an inverter output voltage detector E detects voltage vc3 output from the inverter 540. The detected output current ic3 and output voltage vc3 can be input to the controller 550.

The controller 550 can output a control signal for controlling the switching elements of the converter 530. Particularly, the controller 550 can output a turn-on timing signal of the switching elements in the converter 530 based on at least one of the following: the detected input current ic1, input voltage vc1, output current ic2, output voltage vc2, output current ic3, and output voltage vc3.

Further, the controller 550 can output an inverter control signal for controlling the respective switching elements Sa, Sb, S'a, and S'b of the inverter 540. Particularly, the controller 550 can output a turn-on timing signal of the switching elements Sa, Sb, S'a, and S'b of the inverter 540 based on at least one of the following: the detected input current ic1, input voltage vc1, output current ic2, output voltage vc2, output current ic3, and output voltage vc3.

In addition, the controller 550 can calculate the maximum power point of the solar cell module 100, and accordingly can control the converter 530 to output DC power corresponding to the maximum power.

The communicator 580 can perform communication with the gateway 80.

For example, the communicator 580 can exchange data with the gateway 80 through power line communication.

Further, the communicator 580 can transmit current information, voltage information, power information, and the like, of the photovoltaic module 50 to the gateway 80.

In addition, the filter 570 can be disposed at an output terminal of the inverter 540.

The filter 570 can include a plurality of passive devices, and can adjust a phase difference between the alternating current io and the alternating voltage vo, which are output from the inverter 540, based on at least some of the plurality of passive devices.

Figure 5A:
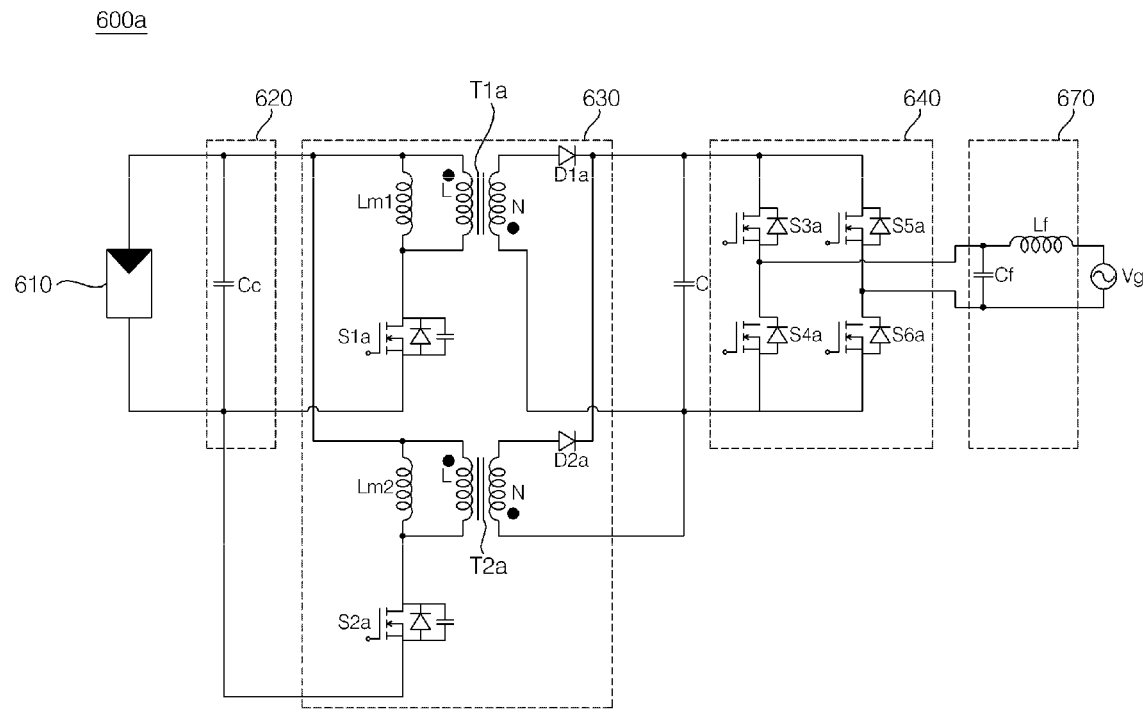
FIGS. 5A and 5B are diagrams illustrating various examples of a power converting device of a photovoltaic module.
Figure 5B:
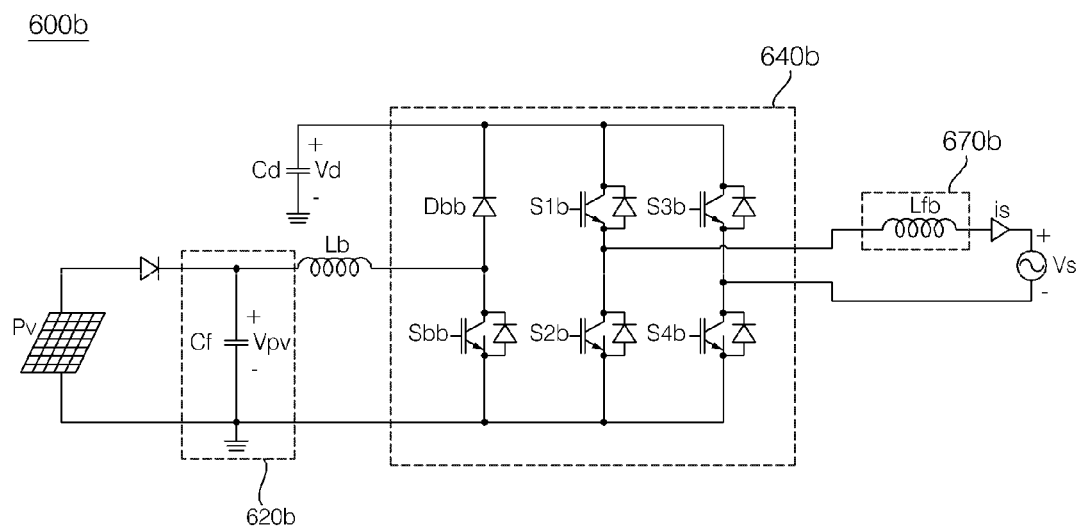

FIGS. 5A and 5B are diagrams illustrating various examples of a power converting device of a photovoltaic module.

In FIG. 5A, a power converting device 600a of a photovoltaic module includes a bypass diode part 610, a capacitor part 620, a converter 630, an inverter 640, and a filter 670.

The converter 630 of FIG. 5A includes an interleaved flyback converter, in which transformers T1a and T1b are used such that an input side is insulated from an output side, and a voltage conversion ratio is high, but it is difficult to control power factor (pf).

In FIG. 5B, a power converting device 600b of a photovoltaic module includes a capacitor part 620b, a power converter 640b, and a filter 670b.

In addition to switching elements S1b to S4b related to the full-bridge inverter, the power converting device 640b further includes a diode Dbb and a switching element Sbb.

In the power converter 640b of FIG. 5B, power factor (pf) can be controlled, but the power converter 640b is of a non-insulated type, and has drawbacks in that a voltage conversion ratio is low, and a separate protection circuit is required to satisfy regulations regarding a leakage current. Further, the power converter 640b also has a drawback in that when switching, hard-switching causes hard-switching loss, leading to low power conversion efficiency.

The present disclosure provides a method of providing stable power output by a two-stage power converting device, and a method of reducing loss of output power.

FIG. 6 is a circuit diagram of a power converting device in a photovoltaic module according to an embodiment of the present invention; and FIGS. 7 to 12 are diagrams referred to in explaining the power converting device of FIG. 6.

Referring to the drawings, in addition to a converter 530 and an inverter 540 illustrated therein, the power converting device 500 in the photovoltaic module 50 can include a bypass diode part 510, a capacitor part 520, a controller 550, a communicator 580, an input current detector A, an input voltage detector B, a converter output current detector C, a converter output voltage detector D, an inverter output current detector E, and an inverter output voltage detector F, which are illustrated in FIG. 4.

Moreover, a filter 570 for reducing an electromagnetic wave noise can be further included on an output terminal of the inverter 540, in which the filter 570 can include at least one inductor.

Hereinafter, description will be made based on the converter 530, the inverter 540, and the like illustrated in FIG. 6.

The power converting device 500 in the photovoltaic module 50 according to an embodiment of the present invention includes: a solar cell module 100 having a plurality of solar cells 130; a converter 530 to convert a level of first direct current power Vin input from the solar cell module 100 to output second direct current power; an inverter 540 to convert the direct current power, supplied from the converter 530, into alternating current power Vac; and a controller 550 to control the converter 530 and the inverter 540.

The converter 530 according to an embodiment of the present invention can include: a full-bridge switching part 532 to perform switching of the first DC power Vin; a transformer 536 having input sides na and nb connected to an output terminal of the full-bridge switching part 532; and a half-bridge switching part 538 connected to output sides nc and nd of the transformer 536.

The controller 550 can change a switching frequency of the full-bridge switching part 532 and the half-bridge switching part 538 in a first section Pba and Pbb. In this manner, even in the instance where DC power Vin input from the solar cell module 100 is low, stable power output can be provided without limiting the range of output power.

Further, switching loss can be reduced in the two-stage power converting device.

The converter 530 in the power converting device 500 of the photovoltaic module 50 can further include an inductor Lr connected between the transformer 536 and the half-bridge switching part 538.

In this instance, the inductor Lr is required for energy transfer between the transformer 536 and the half-bridge switching part 538.

The inductor Lr can be omitted, and leakage inductance of the transformer 536 can perform the function of the inductor Lr instead.

As illustrated in the drawings, the full-bridge switching part 532 can include a first switching element Q1 and a second switching element Q2 which are connected in parallel with each other, and a third switching element Q3 and a fourth switching element Q4 which are connected in series with the first switching element Q1 and the second switching element Q2 respectively.

Further, the input sides na and nb of the transformer 536 can be connected between a first node N1, which is between the first switching element Q1 and the second switching element Q2, and a second node N2 which is between the third switching element Q3 and the fourth switching element Q4.

As illustrated in the drawings, the half-bridge switching part 538 can include a fifth switching element Q5 and a sixth switching element Q6 which are connected in series with each other, and a first capacitor C1 and a second capacitor C2 which are connected in series with each other.

In this instance, the fifth switching element Q5 and the sixth switching element Q6, and the first capacitor C1 and the second capacitor C2, can be connected in parallel with each other.

Further, the output sides nc and nd of the transformer 536 can be connected between a third node Nd, which is between the fifth switching element Q5 and the sixth switching element Q6, and a fourth node N4 which is between the first capacitor C1 and the second capacitor C2.

The controller 550 can output a switching control signal Sfb for switching the full-bridge switching part 532.

Further, the controller 550 can output a switching control signal Shb for switching the half-bridge switching part 532.

In addition, the controller 550 can output a switching control signal Sic for switching the inverter 540.

Figure 7:
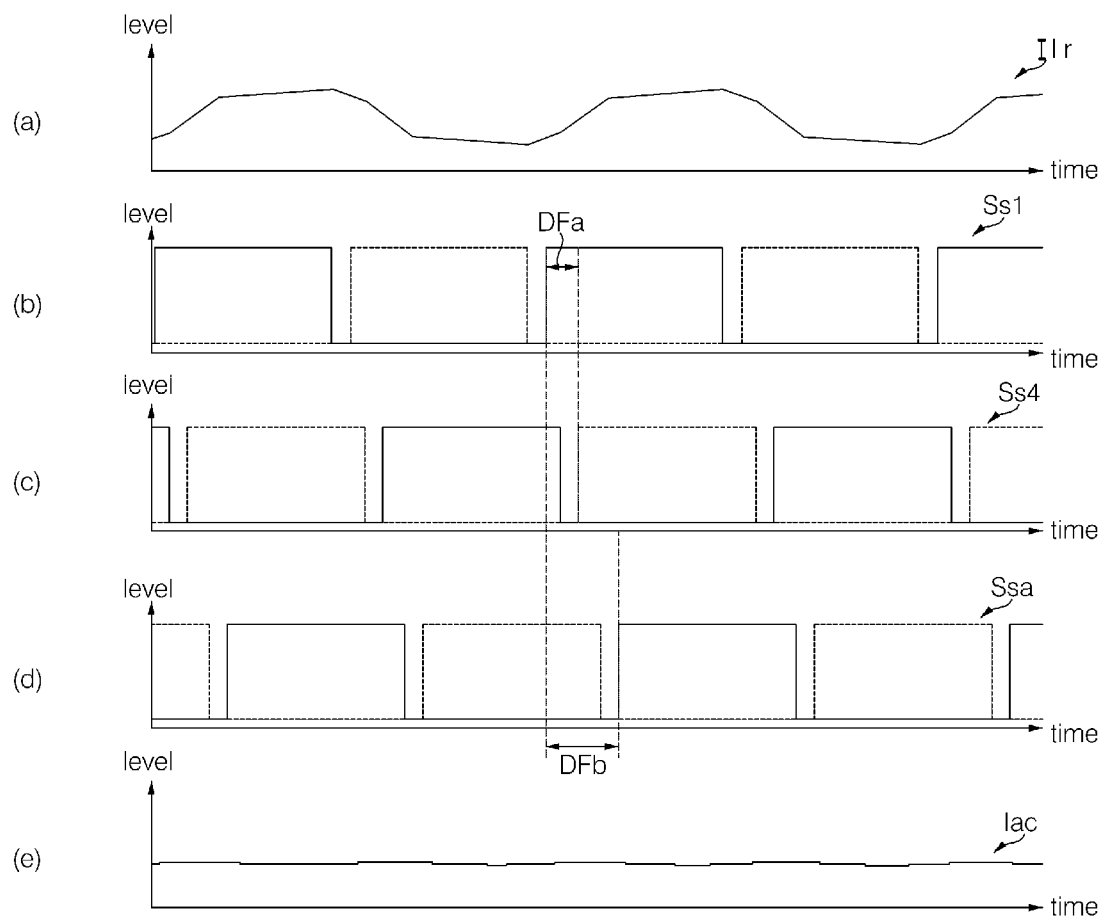

FIG. 7 is a diagram illustrating various waveforms in the power converting device 500.

In FIG. 7, (a) illustrates a waveform of a current Ilr passing through the inductor Lr.

In FIG. 7, (b) illustrates a waveform of a switching control signal Ss1 applied to the switching element S1 in the full-bridge switching part 532.

In FIG. 7, (c) illustrates a waveform of a switching control signal Ss4 applied to the switching element S4 in the half-bridge switching part 538.

In FIG. 7, (d) illustrates a waveform of a switching control signal Ssa applied to a switching element Sa in the inverter 540.

In FIG. 7, (e) illustrates a waveform of an output current Iac which is output from the inverter 540.

Upon comparing the switching control signal Ss1 of the full-bridge switching part 532 with the switching control signal Ss4 of the half-bridge switching part 538, it can be seen that a first phase difference Dfa occurs between the full-bridge switching part 532 and the half-bridge switching part 538.

That is, there is the first phase difference Dfa between the switching control signal Ss1 of the full-bridge switching part 532 and the switching control signal Ss4 of the half-bridge switching part 538.

Then, upon comparing the switching control signal Ss1 of the of the full-bridge switching part 532 and the switching control signal Ssa of the inverter 540, a second phase difference Dfb occurs between the full-bridge switching part 532 and the inverter 540.

That is, there is the second phase difference Dfb between the switching control signal Ss1 of the full-bridge switching part 532 and the switching control signal Ssa of the inverter 540.

In this instance, the second phase difference Dfb can be greater than the first phase difference Dfa.

The controller 550 can change the switching frequency of the full-bridge switching part 532 and the half-bridge switching part 538 according to a waveform of the output voltage Vac of the inverter 540, which will be described with reference to FIG. 8 and the following drawings.

Figure 8:
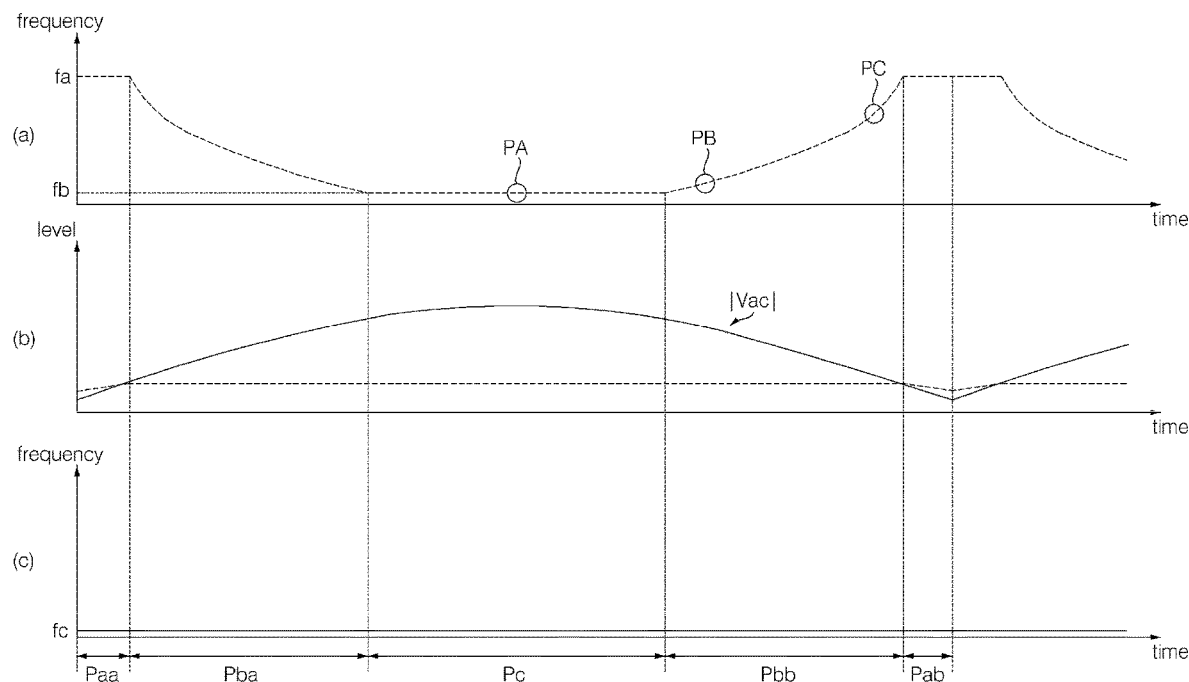

FIG. 8 provide diagrams illustrating a switching frequency of a full-bridge switching part 532 and a half-bridge switching part 538 according to a waveform of an output voltage Vac. In FIG. 8, (a) shows a frequency versus time graph involving first and second frequencies fa and fb, (b) shows a level versus time graph, and (c) shows a frequency versus time graph involving a switching frequency fc.

Referring to FIG. 8, an absolute value |Vac| of an output voltage waveform can have a frequency of 120 Hz which is approximately twice a system frequency of 60 Hz.

The present disclosure provides a method of stably outputting a system voltage even in the instance where a level of direct current power Vin produced by the solar cell module 100 is low.

To this end, in the present disclosure, the switching frequency of the full-bridge switching part 532 and the half-bridge switching part 538 is changed based on an absolute value |Vin| of the input voltage Vin or the absolute value |Vac| of the output voltage waveform.

If the switching frequency of the full-bridge switching part 532 and the half-bridge switching part 538 is constant, power output is limited, such that the present disclosure provides a method of changing the switching frequency of the full-bridge switching part 532 and the half-bridge switching part 538 for stable power output.

As the switching frequency increases, the output power decreases; and as the switching frequency decreases, the output power increases, such that in the present disclosure, the switching frequency can be changed based on such feature.

For example, as illustrated in FIG. 8, the switching frequency can be changed in reverse proportion to the absolute value |Vin| of the input voltage Vin or the absolute value |Vac| of the output voltage waveform.

In FIG. 8, a section Paa to a section Pab correspond to a period of the absolute value |Vac| of the output voltage waveform.

Specifically, in FIG. 8, in the sections Paa and Pba, the absolute value |Vac| of the output voltage waveform is gradually increased; in the section Pc, the absolute value |Vac| of the output voltage waveform has a peak value; and in the sections Pbb and Pab, the absolute value |Vac| of the output voltage waveform is decreased.

The sections Pba and Pbb can be referred to as a first section; the sections Paa and Pab can be referred to as a second section; and the section Pc can be referred to as a third section.

The controller 550 can control driving of the full-bridge switching part 532 and the half-bridge switching part 538 by separating the sections Pba and Pbb where the switching frequency of the full-bridge switching part 532 and the half-bridge switching part 538 is changed from the sections Paa, Pc, and Pab where the switching frequency of the full-bridge switching part 532 and the half-bridge switching part 538 is constant, according to the waveform of the output voltage Vac of the inverter 540.

Particularly, in the second section Paa and Pab, the controller 550 can control the full-bridge switching part 532 and the half-bridge switching part 538 to be driven with a first switching frequency fa; and in the third section Pc, the controller 550 can control the full-bridge switching part 532 and the half-bridge switching part 538 to be driven with a second switching frequency fb which is lower than the first switching frequency fa.

The first section Pba and Pbb can be interposed between the second section Paa and Pab and the third section Pc.

In the first section Pba and Pbb, the controller 550 can change the switching frequency of the full-bridge switching part 532 and the half-bridge switching part 538.

Particularly, in the section Pba which is a section at a transition from the second section Paa to the third section Pc, the controller 550 can control the switching frequency of the full-bridge switching part 532 and the half-bridge switching part 538 to be decreased as illustrated in FIG. 8.

Further, in the section Pbb which is a section at a transition from the third section Pc to the second section Paa and Pab, the controller 550 can control the switching frequency of the full-bridge switching part 532 and the half-bridge switching part 538 to be increased as illustrated in FIG. 8.

As described above, in some sections of the output voltage waveform, the switching frequency of the full-bridge switching part 532 and the half-bridge switching part 538 is changed such that the converter 530 can stably perform voltage level conversion.

In the first section Pba and Pbb, the controller 550 can control the switching frequency fc of the inverter 540 to be constant approximately at 120 Hz.

In addition, in the first section Pba and Pbb, the controller 550 can control the switching frequency of the full-bridge switching part 532 and the half-bridge switching part 538 to be changed in a range of 150 Hz to 40 Khz.

That is, in the first section Pba and Pbb, it is desired that the switching frequency of the full-bridge switching part 532 and the half-bridge switching part 538 is greater than the switching frequency fc of the inverter 540.

As a level of the first DC power Vin, supplied from the solar cell module 100, decreases, the controller 550 can control a second switching frequency fb to be decreased. In this instance, as the switching frequency is lowered, power conversion can be more performed, thereby stably outputting a constant waveform of the output voltage.

As a peak level of the output voltage Vac of the inverter 540 decreases, the controller 550 can control the third section Pc to be increased. In this instance, as the peak level of the output voltage Vac of the inverter 540 decreases, a section of the switching frequency fb increases, such that output power can be increased.

When changing the switching frequency of the full-bridge switching part 532 and the half-bridge switching part 538 in the first section Pba and Pbb, the controller 550 can change the first phase difference Dfa between the full-bridge switching part 532 and the half-bridge switching part 538 as illustrated in FIG. 7B.

Further, when changing the switching frequency of the full-bridge switching part 532 and the half-bridge switching part 538 in the first section Pba and Pbb, the controller 550 can change the second phase difference Dfb between the full-bridge switching part 532 and the inverter 540 as illustrated in FIG. 7B.

Figure 9A:
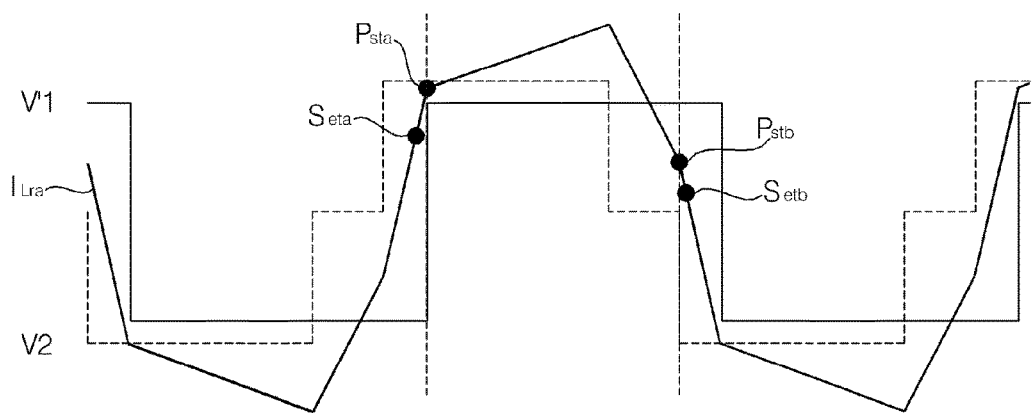
Figure 9B:
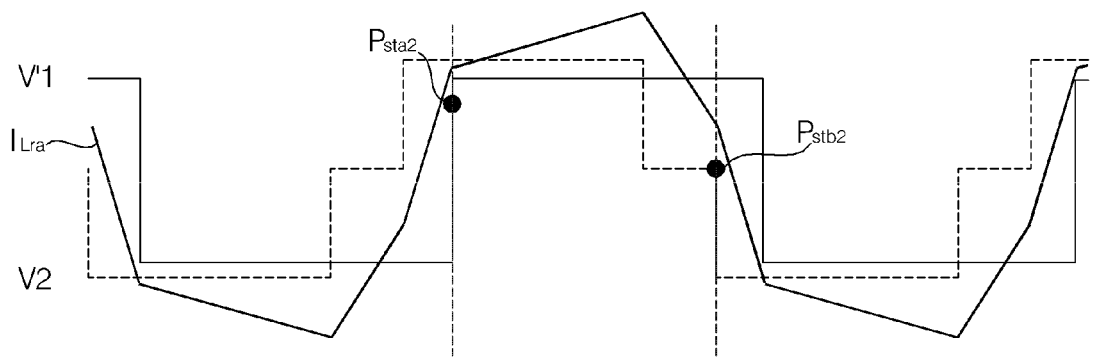
Figure 9C:
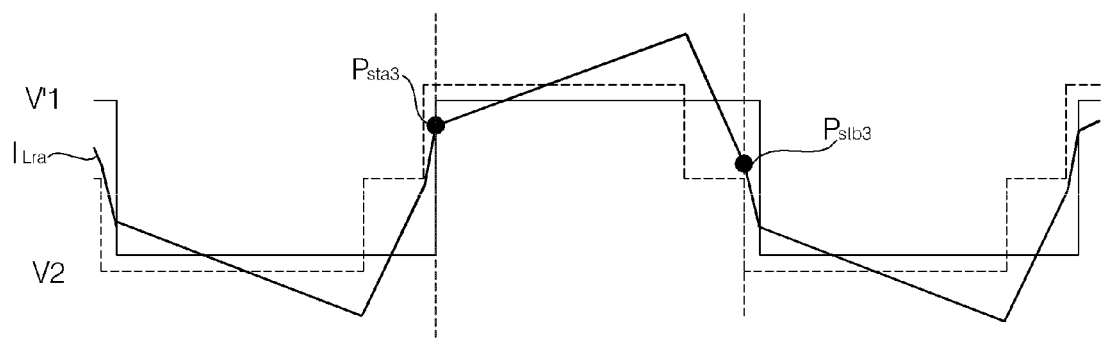

FIGS. 9A to 9C are diagrams illustrating inductor current waveforms ILra, ILrb, and ILrc at points PA, PB, and PC of FIG. 8.

Referring to FIG. 9A, the point PA is a point in the third section Pc where the full-bridge switching part 532 and the half-bridge switching part 538 are driven with a minimum switching frequency fb.

In this instance, commutation current values Psta and Pstb of the full-bridge switching part 532 and the half-bridge switching part 538 can be higher than set values Seta and Setb.

Then, referring to FIG. 9B, the point PB is a point in the first section Pbb where the switching frequency of the full-bridge switching part 532 and the half-bridge switching part 538 is changed.

In this instance, the commutation current value of the half-bridge switching part 538 is greater than the commutation current value Psta2 and Pstb2 of the full-bridge switching part 532.

Next, referring to FIG. 9C, the point PC is a point in the first section Pbb where the switching frequency of the full-bridge switching part 532 and the half-bridge switching part 538 is changed.

In this instance, the commutation current value of the half-bridge switching part 538 is greater than the commutation current value Psta3 and Pstb3 of the full-bridge switching part 532.

The commutation current value of the half-bridge switching part 538 of FIG. 9C can be smaller than the commutation current value of the half-bridge switching part 538 of FIG. 9B.

Referring to FIGS. 9A to 9C, it can be seen that when changing the switching frequency, a shape of a waveform of the current flowing through the inductor Lr is constant.

That is, in the first section Pba and Pbb, the controller 550 can change the switching frequency of the full-bridge switching part 532 and the half-bridge switching part 538, and can control the shape of the waveform of the current flowing through the inductor Lr to be constant. In this instance, a level of the current flowing through the inductor Lr can be lowered as the switching frequency is increased.

That is, upon comparison of FIG. 9B with FIG. 9C, the switching frequency is higher in FIG. 9C than that in FIG. 9B, but the level of current flowing through the inductor Lr decreases.

Figure 10A:
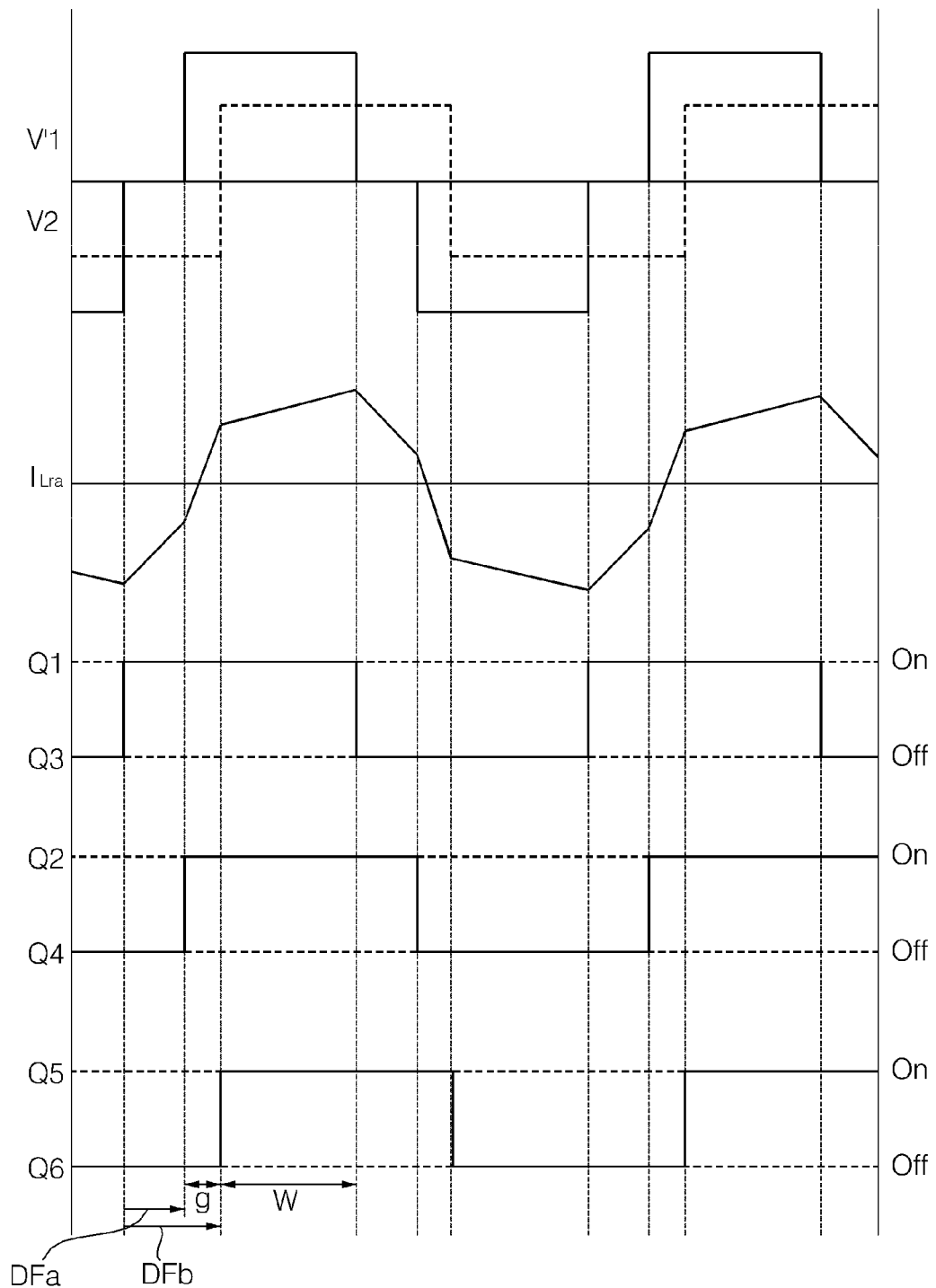

FIG. 10A illustrates a voltage waveform V'1 on an output side of a transformer and a voltage waveform V2 on both ends of an inductor Lr, as well as a waveform of a current flowing through the inductor Lr.

In addition, FIG. 10A also illustrates a waveform of a switching control signal applied to each of the switching elements Q1 to Q6.

Here, g denotes a phase difference between the switching element Q4 and the switching element Q6; and w denotes a phase difference between the switching element Q6 and the switching element Q3.

Figure 10B:
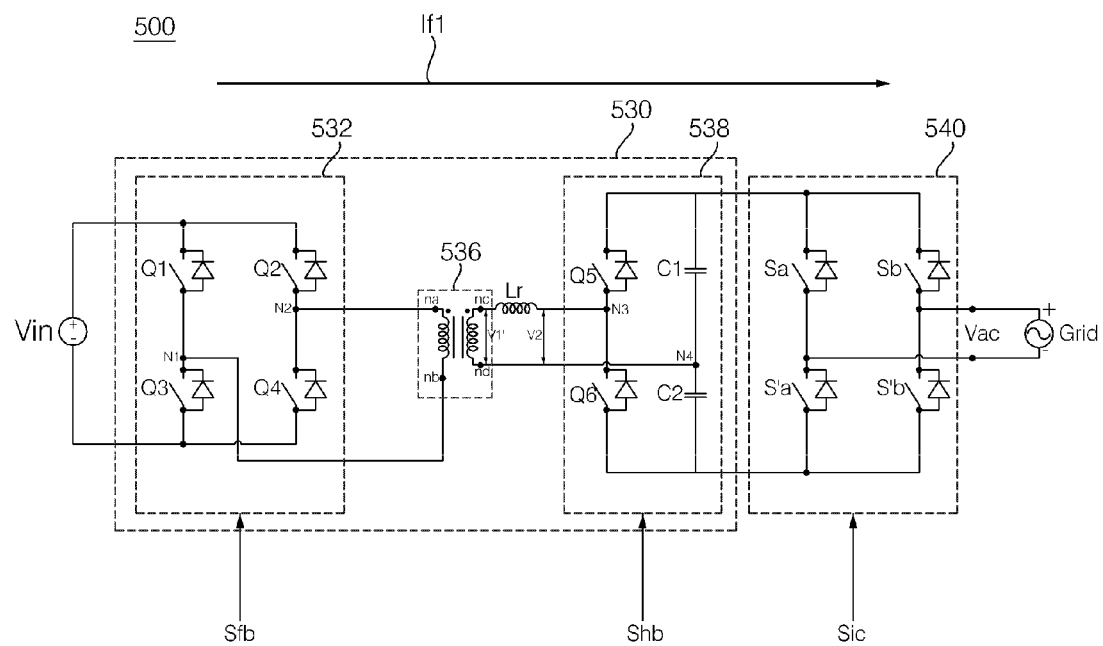

Each waveform illustrated in FIG. 10A is in an active power mode, and is a waveform of a current Lf1 flowing from the converter 530 to the inverter 540 as illustrated in FIG. 10B.

Figure 10C:
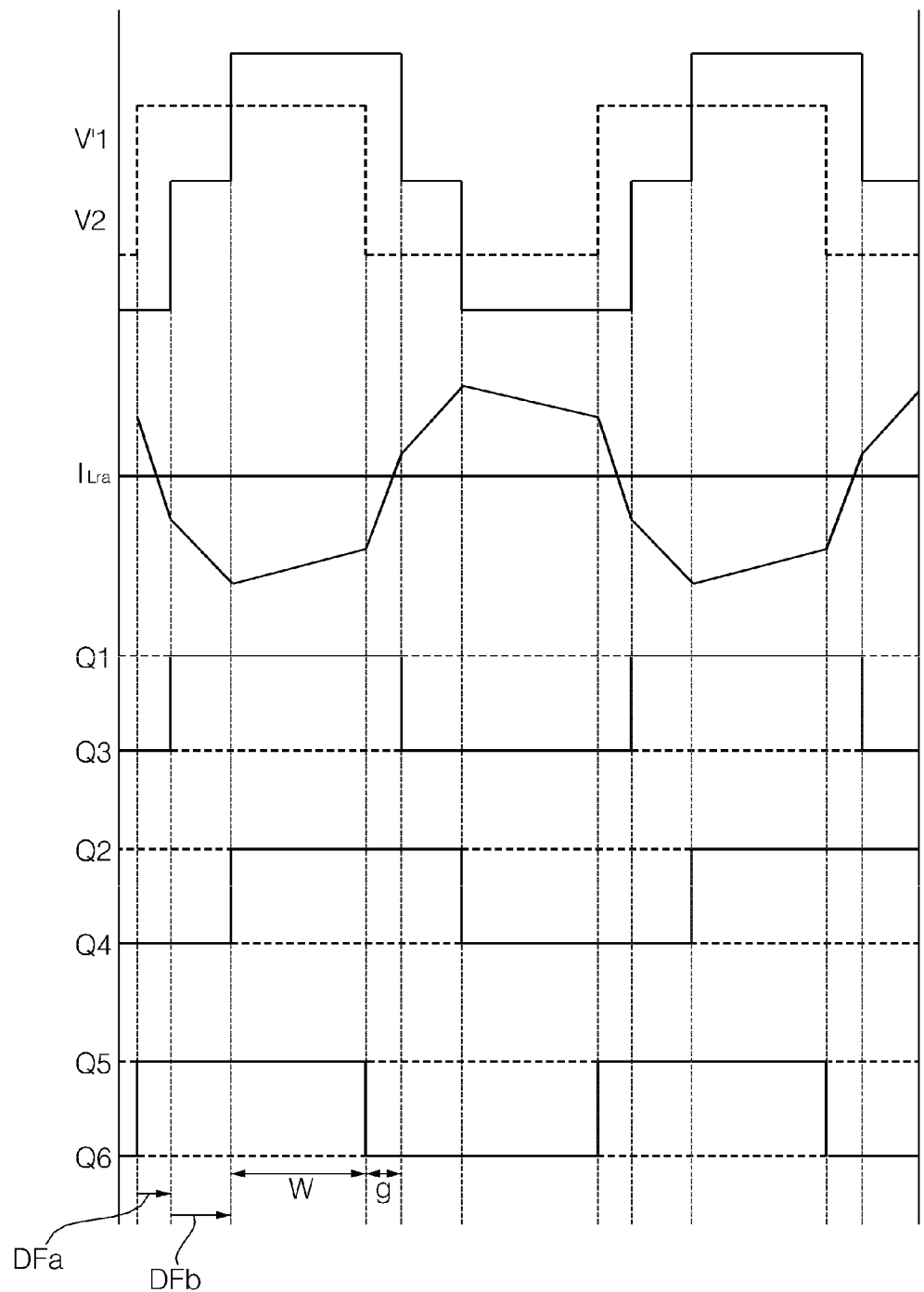

FIG. 10C illustrates a voltage waveform V'1 on an output side of a transformer and a voltage waveform V2 on both ends of an inductor Lr, as well as a waveform of a current flowing through the inductor Lr.

In addition, FIG. 10C also illustrates a waveform of a switching control signal applied to each of the switching elements Q1 to Q6.

Here, w denotes a phase difference between the switching element Q4 and the switching element Q6; and g denotes a phase difference between the switching element Q5 and the switching element Q3.

Figure 10D:
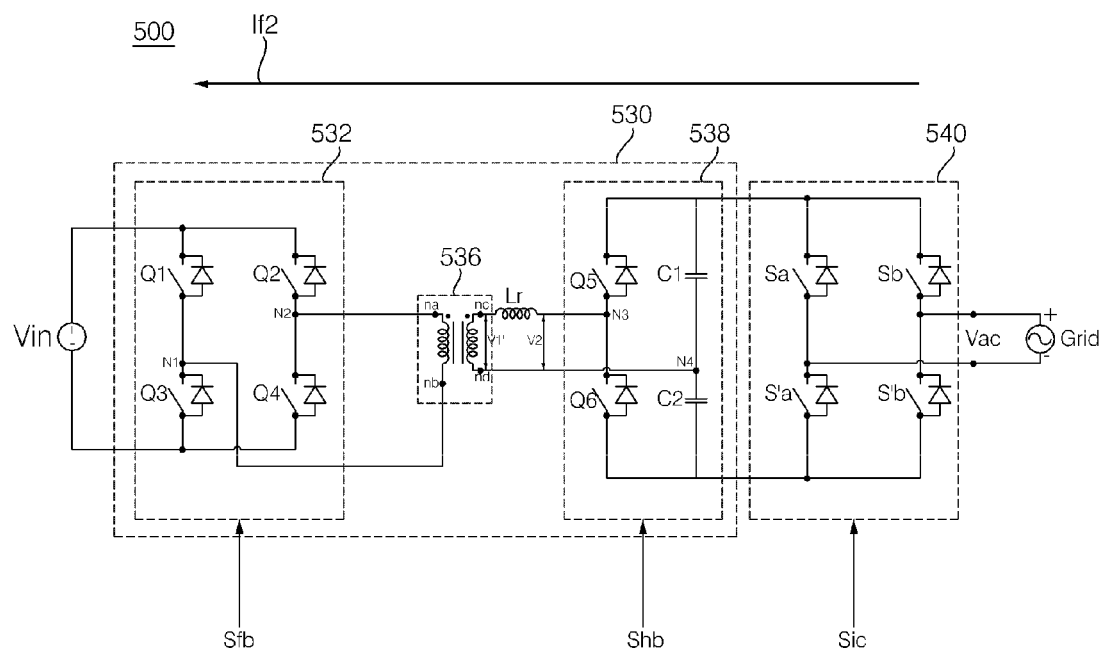

Each waveform illustrated in FIG. 10C is in a reactive power mode, and is a waveform of a current Lf2 flowing from the inverter 540 to the converter 530 as illustrated in FIG. 10D.

Figure 11A:
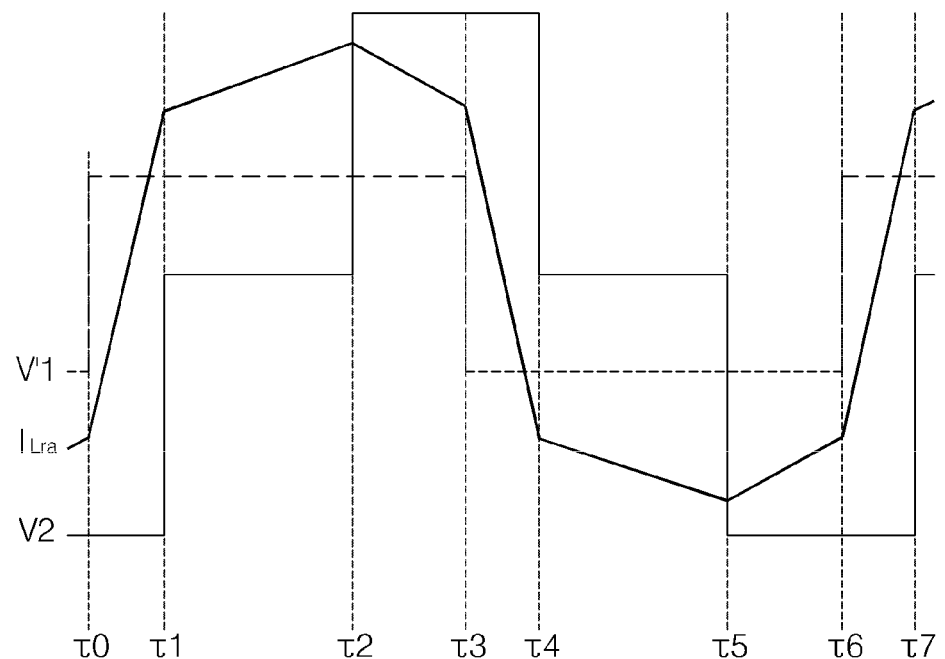
Figure 11B:
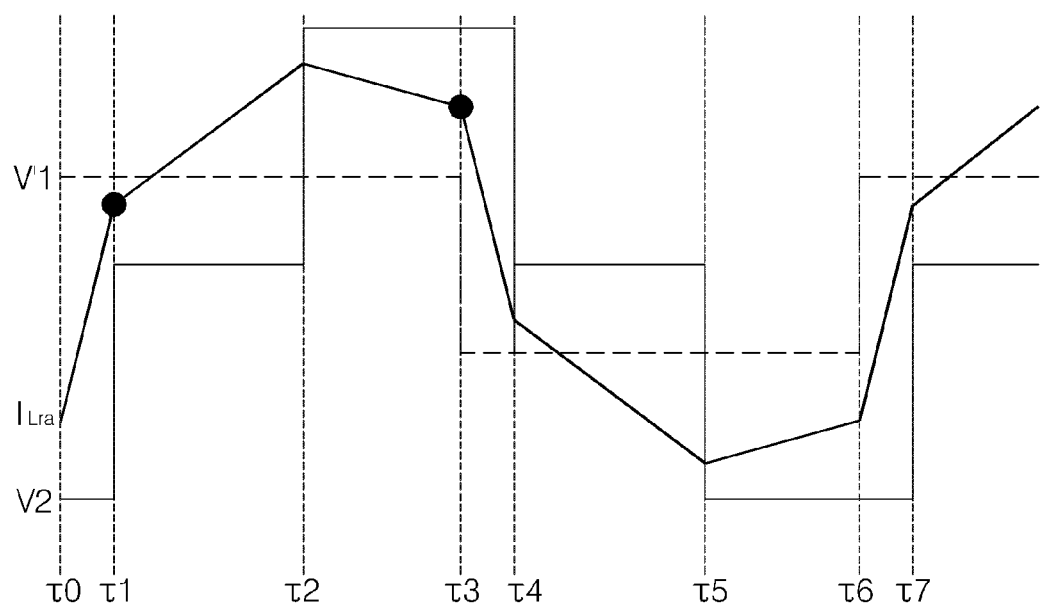

FIG. 11A illustrates a commutation current waveform of the full-bridge switching part 532; and FIG. 11B illustrates a commutation current waveform of the half-bridge switching part 538.

When changing the switching frequency, the controller 550 can separate the commutation current of the full-bridge switching part 532 from the commutation current of the half-bridge switching part 538.

To this end, the controller 550 can calculate a current value at each of points T0, T1, T2, and T3 by reference to the following Equations 1 to 4.

$$iL_\sigma(\tau_0) = -\frac{\frac{V_{ac}}{4} + (g-w)V_{sec}}{2f_sL_\sigma} \quad \text{[Equation 1]}$$

$$iL_\sigma(\tau_1) = \frac{\frac{1}{4}V_{ac} - wV_{sec}}{2f_sL_\sigma} = I_{\tau_1\_Com} \quad \text{[Equation 2]}$$

$$iL_\sigma(\tau_2) = \frac{\left(\frac{1}{4}-w\right)V_{ac} + (g+w)V_{sec}}{2f_sL_\sigma} = I_{t2\_Com} \quad \text{[Equation 3]}$$

$$iL_\sigma(\tau_3) = \frac{\frac{V_{ac}}{4} + (g-w)V_{sec}}{2f_sL_\sigma} \quad \text{[Equation 4]}$$

Herein, Vac denotes an output voltage; fs denotes a switching frequency; $L_\tau$ denotes inductance; g and w denote a phase difference; and Vsec denotes an input voltage Vin.

Further, $I_{\tau_1\_Com}$ and $I_{\tau_2\_Com}$ can denote a switch communication current at points T1 and T2 respectively.

In order to perform zero voltage switching (ZVS), it is desired that each switching element of the full-bridge switching part 532 and the half-bridge switching part 538 satisfies requirements of the following Equation 5.

$$N \cdot iL_\sigma(\tau_1) > I_{ComPri}$$

$$N \cdot iL_\sigma(\tau_2) > I_{ComPri}$$

$$iL_\sigma(\tau_3) > I_{ComSec} \quad \text{[Equation 5]}$$

part according to a waveform of an output voltage of the inverter, thereby enabling stable output of AC power.

Further, the controller can perform two-stage power conversion by using the converter and the inverter, thereby improving power factor.

In FIG. 12, (a) is a graph of a switching frequency Fsw versus DC power Vin, which is directly proportional, and (b) is a graph of a switching frequency Fsw versus DC power Vin, which is inversely proportional, according to embodiments of the present invention.

Figure 13:
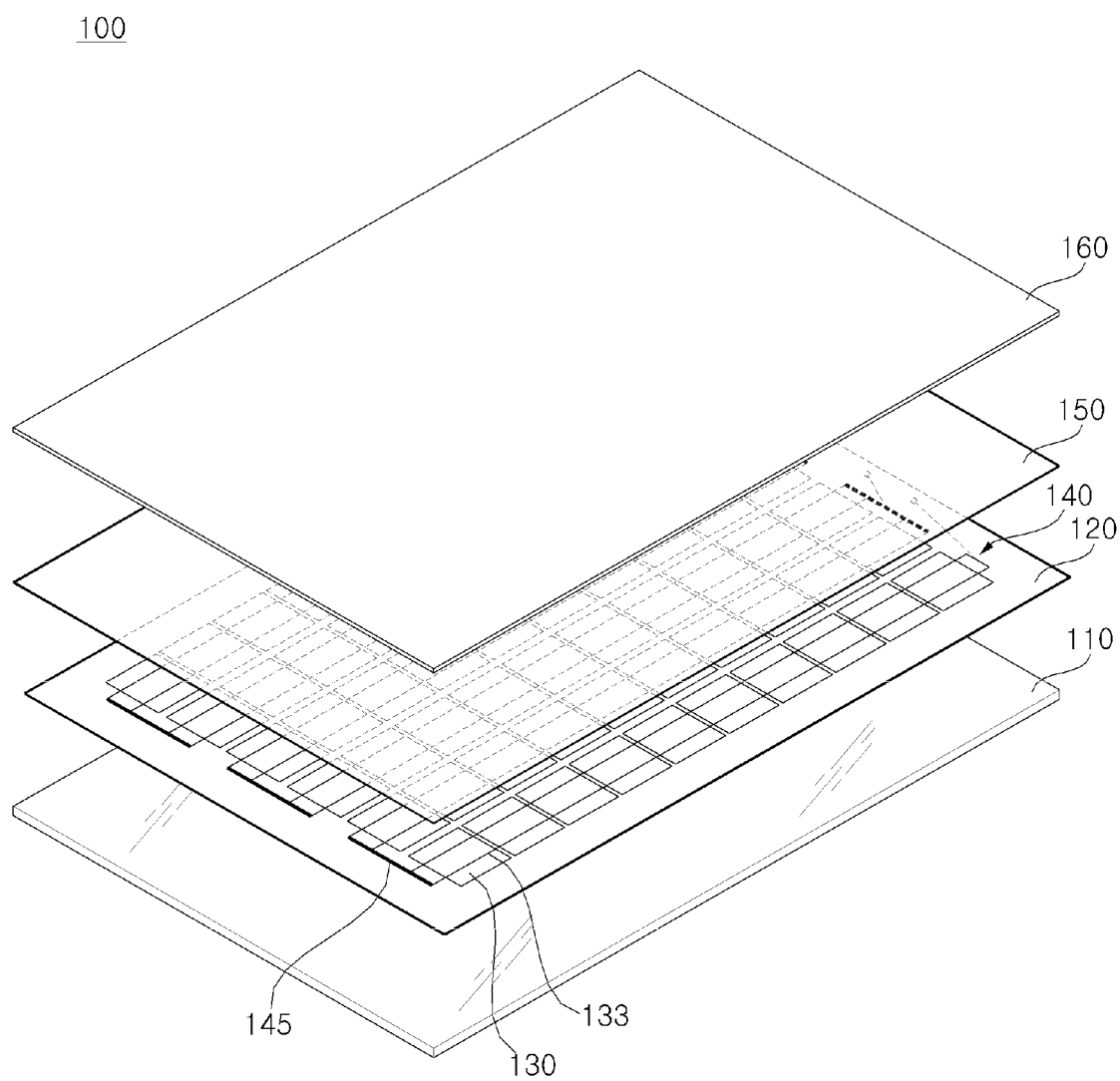
FIG. 13 is an exploded perspective view of a solar cell module of FIG. 3.

FIG. 13 is an exploded perspective view of a solar cell module 100. The solar cell module 100 includes first and second covers 160 and 110, first and second protective layers 150 and 120, a plurality of solar cells 130, a plurality of solar cell strings 140, ribbons 133, and bus ribbons 145.

In accordance with another embodiment of the present invention, there is provided a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter includes: a full-bridge switching part to switch the first DC power; a transformer having an input side connected to an output terminal of the full-bridge switching part; and a half-bridge switching part connected to an output side of the transformer, wherein when changing a switching frequency of the full-bridge switching part and the half-bridge switching part, the controller changes a first phase difference between the full-bridge switching part and the half-bridge switching part, thereby enabling stable power output.

In accordance with yet another embodiment of the present invention, there is provided a photovoltaic module including: a solar cell module including a plurality of solar cells; a converter to convert a level of first direct current (DC) power input from the solar cell module, and to output second DC power; an inverter to convert the second DC power supplied from the converter into alternating current (AC) power; and a controller to control the converter and the inverter, wherein the converter includes: a full-bridge switching part to switch the first DC power; a transformer having an input side connected to an output terminal of the full-bridge switching part; and a half-bridge switching part connected to an output side of the transformer, wherein the controller controls driving of the full-bridge switching part and the half-bridge switching part by separating a section where a switching frequency of the full-bridge switching part and the half-bridge switching part is changed from a section where the switching frequency of the full-bridge switching part and the half-bridge switching part is constant, according to a waveform of an output voltage of the inverter, thereby enabling stable power output.

As described, the photovoltaic module is not limited to the configuration and method of the above-described embodiments, and all or some of the above embodiments can be selectively combined with each other to enable various modifications thereof.

While the present disclosure has been shown and described with reference to the exemplary embodiments thereof, it should be understood that the present disclosure is not limited to the specific embodiments, and various modifications and variations can be made by those skilled in the art without departing from the scope and spirit of the invention as defined by the appended claims, and the modified implementations should not be construed independently of the technical idea or prospect of the present disclosure.

What is claimed is:
1. A photovoltaic module comprising:
a solar cell module including a plurality of solar cells;
a converter to convert a level of first direct current (DC) power input from the solar cell module, and to output second DC power;

an inverter to convert the second DC power supplied from the converter into alternating current (AC) power; and
a controller to control the converter and the inverter,
wherein the converter comprises:
- a full-bridge switching part to switch the first DC power;
- a transformer having an input side connected to an output terminal of the full-bridge switching part; and
- a half-bridge switching part connected to an output side of the transformer, wherein the controller changes a switching frequency of the full-bridge switching part and the half-bridge switching part in a first section of a waveform,
wherein the controller controls the full-bridge switching part and the half-bridge switching part to be driven with a first switching frequency in a second section of the waveform, and controls the full-bridge switching part and the half-bridge switching part to be driven with a second switching frequency, which is lower than the first switching frequency, in a third section of the waveform, and
wherein the first section is disposed between the second section and the third section.

2. The photovoltaic module of claim 1, wherein when changing the switching frequency of the full-bridge switching part and the half-bridge switching part in the first section, the controller changes a first phase difference between the full-bridge switching part and the half-bridge switching part.

3. The photovoltaic module of claim 1, wherein when changing the switching frequency of the full-bridge switching part and the half-bridge switching part in the first section, the controller changes a second phase difference between the full-bridge switching part and the inverter.

4. The photovoltaic module of claim 1, wherein the full-bridge switching part comprises:
- a first switching element and a second switching element which are connected in parallel with each other; and
- a third switching element and a fourth switching element which are connected in series with the first switching element and the second switching elements respectively, wherein the input side of the transformer is connected between a first node, which is between the first switching element and the second switching element, and a second node which is between the third switching element and the fourth switching element.

5. The photovoltaic module of claim 1, wherein the converter further comprises an inductor connected between the transformer and the half-bridge switching part.

6. The photovoltaic module of claim 1, wherein the controller controls a switching frequency of the inverter to be constant in the first section.

7. The photovoltaic module of claim 6, wherein the switching frequency of the full-bridge switching part and the half-bridge switching part is greater than the switching frequency of the inverter in the first section.

8. The photovoltaic module of claim 1, wherein:
at a transition from the second section to the third section, the controller controls the switching frequency of the full-bridge switching part and the half-bridge switching part to be decreased; and
at a transition from the third section to the second section, the controller controls the switching frequency of the full-bridge switching part and the half-bridge switching part to be increased.

9. The photovoltaic module of claim 1, wherein as the level of the first direct current (DC) power supplied from the solar cell module decreases, the controller controls the second switching frequency to be decreased.

10. The photovoltaic module of claim 1, wherein as a peak level of an output voltage of the inverter decreases, the controller controls the third section to be increased.

11. The photovoltaic module of claim 1, wherein the controller changes the switching frequency of the full-bridge switching part and the half-bridge switching part according to the waveform of an output voltage of the inverter.

12. The photovoltaic module of claim 5, wherein the controller changes the switching frequency of the full-bridge switching part and the half-bridge switching part in the first section, and when changing the switching frequency, the controller controls a shape of a waveform of a current flowing through the inductor to be constant.

13. The photovoltaic module of claim 1, wherein the controller controls driving of the full-bridge switching part and the half-bridge switching part by separating a section where the switching frequency of the full-bridge switching part and the half-bridge switching part is changed from a section where the switching frequency of the full-bridge switching part and the half-bridge switching part is constant, according to the waveform of the output voltage of the inverter.

14. A photovoltaic module comprising:
a solar cell module including a plurality of solar cells;
a converter to convert a level of first direct current (DC) power input from the solar cell module, and to output second DC power;
an inverter to convert the second DC power supplied from the converter into alternating current (AC) power; and
a controller to control the converter and the inverter,
wherein the converter comprises:
- a full-bridge switching part to switch the first DC power;
- a transformer having an input side connected to an output terminal of the full-bridge switching part; and
- a half-bridge switching part connected to an output side of the transformer, wherein when changing a switching frequency of the full-bridge switching part and the half-bridge switching part, the controller changes a first phase difference between the full-bridge switching part and the half-bridge switching part,
wherein the half-bridge switching part comprises:
- a fifth switching element and a sixth switching element which are connected in series; and
- a first capacitor and a second capacitor which are connected in series, and wherein the output side of the transformer is connected between a third node, which is between the fifth switching element and the sixth switching element, and a fourth node which is between the first capacitor and the second capacitor.

15. The photovoltaic module of claim 14, wherein when changing the switching frequency of the full-bridge switching part and the half-bridge switching part in a first section, the controller changes a second phase difference between the full-bridge switching part and the inverter.

16. The photovoltaic module of claim 15, wherein the second phase difference is greater than the first phase difference.

17. A photovoltaic module comprising:
a solar cell module including a plurality of solar cells;

a converter to convert a level of first direct current (DC) power input from the solar cell module, and to output second DC power;

an inverter to convert the second DC power supplied from the converter into alternating current (AC) power; and a controller to control the converter and the inverter, wherein the converter comprises:
- a full-bridge switching part to switch the first DC power;
- a transformer having an input side connected to an output terminal of the full-bridge switching part; and
- a half-bridge switching part connected to an output side of the transformer, wherein the controller controls driving of the full-bridge switching part and the half-bridge switching part by separating a section where a switching frequency of the full-bridge switching part and the half-bridge switching part is changed from a section where the switching frequency of the full-bridge switching part and the half-bridge switching part is constant, according to a waveform of an output voltage of the inverter, wherein the half-bridge switching part comprises:
- a fifth switching element and a sixth switching element which are connected in series; and
- a first capacitor and a second capacitor which are connected in series, and wherein the output side of the transformer is connected between a third node, which is between the fifth switching element and the sixth switching element, and a fourth node which is between the first capacitor and the second capacitor.

18. The photovoltaic module of claim 17, wherein:
in a first section of the waveform of the output voltage, the controller changes the switching frequency of the full-bridge switching part and the half-bridge switching part;

in a second section of the waveform of the output voltage, the controller controls the full-bridge switching part and the half-bridge switching part to be driven with a first switching frequency;

in a third section of the waveform of the output voltage, the controller controls the full-bridge switching part and the half-bridge switching part to be driven with a second switching frequency which is lower than the first switching frequency, wherein the first section is disposed between the second section and the third section.

19. The photovoltaic module of claim 17, wherein the full-bridge switching part comprises:
- a first switching element and a second switching element which are connected in parallel with each other; and
- a third switching element and a fourth switching element which are connected in series with the first switching element and the second switching elements respectively, wherein the input side of the transformer is connected between a first node, which is between the first switching element and the second switching element, and a second node which is between the third switching element and the fourth switching element.

20. The photovoltaic module of claim 14, wherein the full-bridge switching part comprises:
- a first switching element and a second switching element which are connected in parallel with each other; and
- a third switching element and a fourth switching element which are connected in series with the first switching element and the second switching elements respectively, wherein the input side of the transformer is connected between a first node, which is between the first switching element and the second switching element, and a second node which is between the third switching element and the fourth switching element.

* * * * *